(12) United States Patent
Winkler

(10) Patent No.: US 6,190,135 B1
(45) Date of Patent: Feb. 20, 2001

(54) COVER FOR A FAN

(75) Inventor: Wolfgang Arno Winkler, St. Georgen (DE)

(73) Assignee: Pabst-Motoren GmbH & Co. KG, Georgen (DE)

(*) Notice: Under 35 U.S.C. 154(b), the term of this patent shall be extended for 0 days.

(21) Appl. No.: 09/218,254

(22) Filed: Dec. 21, 1998

(30) Foreign Application Priority Data

Dec. 24, 1997 (DE) .......................................... 297 22 850 U

(51) Int. Cl.[7] .................................................. B63H 1/00
(52) U.S. Cl. .............................. 416/247 R; 415/213.1; 415/214.1
(58) Field of Search ............................ 415/121.2, 213.1, 415/214.1, 220, 223; 416/24, 244 R, 247 R; 454/184

(56) References Cited

U.S. PATENT DOCUMENTS

| | | | |
|---|---|---|---|
| 4,724,747 | * 2/1988 | Sturm et al. | 98/1 |
| 5,335,722 | * 8/1994 | Wu | 165/122 |
| 5,590,025 | 12/1996 | Clemens | 361/695 |
| 5,597,034 | 1/1997 | Barker, III et al. | 165/80.3 |
| 5,615,998 | * 4/1997 | Kodama et al. | 415/177 |
| 5,671,120 | 9/1997 | Kikinisi | 361/687 |
| 5,788,566 | * 8/1998 | McAnally et al. | 454/184 |
| 6,031,719 | * 2/2000 | Schmitt et al. | 361/695 |

FOREIGN PATENT DOCUMENTS

| | | |
|---|---|---|
| 3210164 | 10/1983 | (DE) . |
| 92 09 165 | 10/1992 | (DE) . |
| 93 17 507 | 4/1994 | (DE) . |
| 295 00 432 U | 4/1995 | (DE) . |
| 295 04 306 U | 6/1995 | (DE) . |
| 295 14 751 U | 12/1995 | (DE) . |
| 19509904 | 9/1996 | (DE) . |
| 296 09 057 U | 9/1996 | (DE) . |
| 29619504 | 2/1997 | (DE) . |
| 29722850 | 3/1998 | (DE) . |
| 0632500 | 5/1994 | (EP) . |

OTHER PUBLICATIONS

IBM Technical Disclosure Bulletin, vol. 36, No. 11 Nov. 1993, "Insert for High Performance Heat Transfer in a Vertical Cooling Channel".

* cited by examiner

Primary Examiner—Edward K. Look
Assistant Examiner—James M. McAleenan
(74) Attorney, Agent, or Firm—Harness, Dickey & Pierce P.L.C.

(57) ABSTRACT

A cover for a fan (2) which can be mounted on a base (3) for cooling electric sub-assemblies or elements which are located on the base (3) characterized by a cover plate (4) which is equipped with air through-flow openings (5) as well as by fastener elements (10) for the fan which are connected to the cover plate (4) and by elements (11a, 11b) for the base (3) where the fastener elements (10, 11a, 11b) are constructed in such a manner that the cover plate (4) can be detachably attached to the base (3) in the position where it is placed at a distance from the base (3) and where the fan (2), which can be attached to the cover plate (4), is located in an intermediate position.

24 Claims, 3 Drawing Sheets

COVER FOR A FAN

BACKGROUND AND SUMMARY OF THE INVENTION

The present invention concerns a cover for a fan, which can be mounted on a base and which is intended to be used in particular for cooling electronic sub-assemblies or electronic elements which are located on the base.

With respect to the fan, it may, for example, consist of an axial fan or a radial fan, where the base may be, for example, a printed-circuit board, which is equipped with the electronic building blocks, the CPU or the mother board of a computer, or it could also be a heat sink, which is preferably contoured, and which, for its part, serves to conduct heat away from the electronic building blocks. Usually such a fan is attached by means of fastener elements directly to the base in such a manner, that it is easy to assemble it, e.g. it is snapped in place, and as a result it is easily accessible. For making the electrical connection, the fan has connecting pigtails, the ends of which can be equipped with plugs. In transit, these connecting pigtails are wound around the fan and attached by means of an adhesive tape. On the one hand, the fan, when it is in operation, must be protected—especially in its air intake region—against contact with such connecting pigtails, cables, ribbon conductors etc., which may also be extended from or to other sub-assemblies or elements, in order to ensure an unobstructed admission of air and a high level of functional safety of the fans. On the other hand, any contact of electrical connecting cables with the fan, especially with its rotating parts, must be avoided in order to prevent the destruction of the electrical connecting cables, a loosening of the plug-in connections and, related to this, the danger of a disruption of the current flow or the occurrence of short circuit currents.

The present invention is, therefore, based on the objective of constructing a cover of the type described at the beginning, which can be manufactured in an inexpensive manner, and which permits an easy accessibility of the fan and a simple, rapid and safe assembly, and which effectively prevents any contact of the fan with the pigtails, cables, ribbon conductors etc., which are installed in the proximity of the fan, especially in its air intake region.

According to the invention, this is accomplished by means of a cover of the initially described type, which includes a cover plate equipped with air passage openings, and which, on the one hand, includes fastener elements for the fan, and on the other hand, fastener elements for the base, which are connected to the cover plate, while the fastener elements are constructed in such a manner, that the cover plate is placed in a position which is spaced apart from the base, while the fan, which is attached to the cover plate, is mounted on the base plate in an intermediate position in such a manner that it is detachable.

Such a cover can be advantageously mounted without tools or auxiliary devices, while performing its function highly effectively, i.e. providing an effective protection of the fan against being contacted. The assembly process, according to the invention, is implemented in such a manner that the fan is attached only indirectly to the base, i.e. the fan is first attached to the cover, and then the cover with the fan on it is attached to the base. In this process, the first step toward its assembly can already be taken by the manufacturer of the fan within the framework of a pre-assembly process by means of which a fan sub-assembly is produced, which consists of a cover according to the invention which is attached to the fan. Such a sub-assembly permits a simple handling method and a transport free of problems, and it can thus be shipped advantageously as a unit.

In an advantageous further development, the cover according to the invention includes at least two side walls, which are positioned essentially at right angles to the cover plate and opposite to each other, and which have the function of increasing the stability of the cover and which can provide the opportunity for a multiplicity of technical design possibilities, with which further advantages are associated.

The cover according to the invention satisfies advantageously a dual function for the fan: On the one hand, it has the function of protecting the fan, and on the other hand, it provides a means for attaching the fan. In this case, a design is preferred, where the fastener elements of the fan are constructed in such a manner that the fan, which is attached to the bottom side of the cover plate and which, if need be, is located between the side walls, is positioned at a distance from the cover plate. By this means, in the first place, the safe distance from the rotating fan parts to the electrical conductors, which are installed above the cover plate, is advantageously increased, and in the second place, above the fan an unobstructed air intake space having a greater volume has been provided.

Further advantageous characteristics of the embodiments of the invention are contained in the following description:

On the basis of a preferred example of an embodiment shown in the drawing, the following is intended to explain the invention in greater detail. For this purpose, the figures show the following:

BRIEF DESCRIPTION OF THE DRAWINGS

In the different figures of the drawing, the same parts have been given the same reference symbols, so that, as a rule, they are each always described only once.

DETAILED DESCRIPTION OF THE PREFERRED EMBODIMENT

Figure 1:
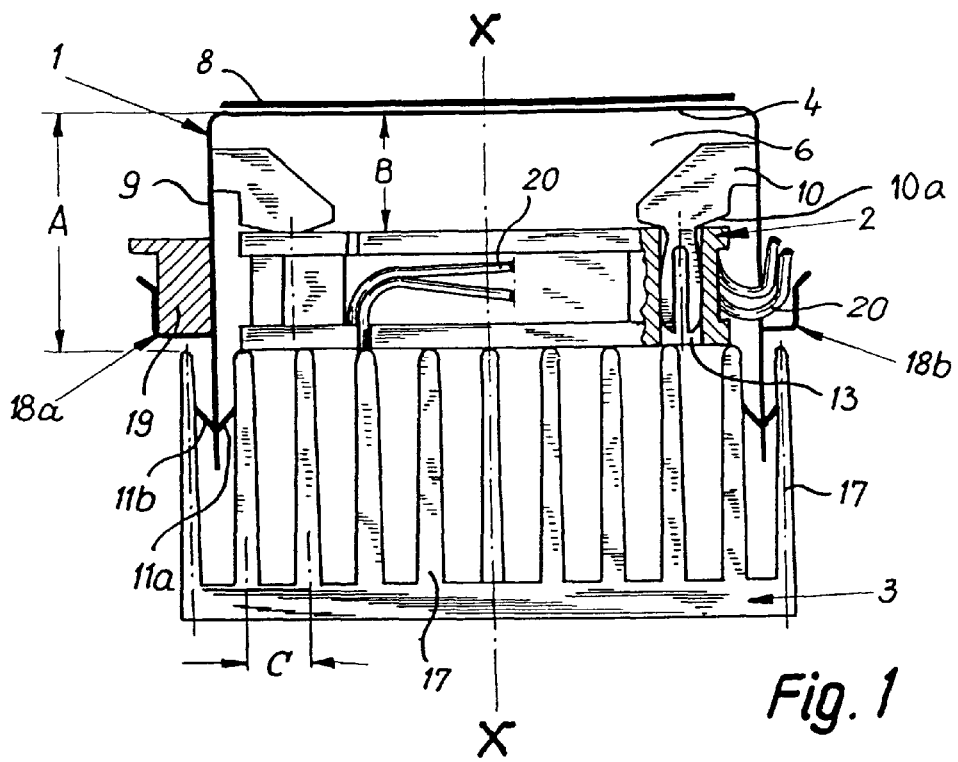
FIG. 1 is a partially exploded view, a front view of a fan with an assembled cover according to the invention.

As can be seen in FIG. 1 of the drawing, a cover 1 according to the invention is intended to be used for a fan 2, which can be mounted on a base 3, and is intended in particular to be used for the purpose of cooling electronic sub-assemblies and elements, which are located on the base 3. The base 3—in the embodiment shown—is a heat sink which has the function of conducting heat away from the electronic building blocks. As has already been mentioned, the base 3 can also be a printed-circuit board assembly, a CPU or the mother board of a computer.

The fan 2 shown is an axial fan, which has a longitudinal axis X—X, in the direction of which the cooling air in the presentation according to FIG. 1 is taken in from above and exhausted toward the bottom. The electronic sub-assemblies and elements to be cooled, as such, are not shown in the drawing. Instead of the axial fan, a radial fan could also have been installed, for which the air intake takes place in the same manner, but where the air is exhausted transversely to the longitudinal axis X—X, i.e. as shown in FIG. 1 in a lateral direction.

Figure 2:
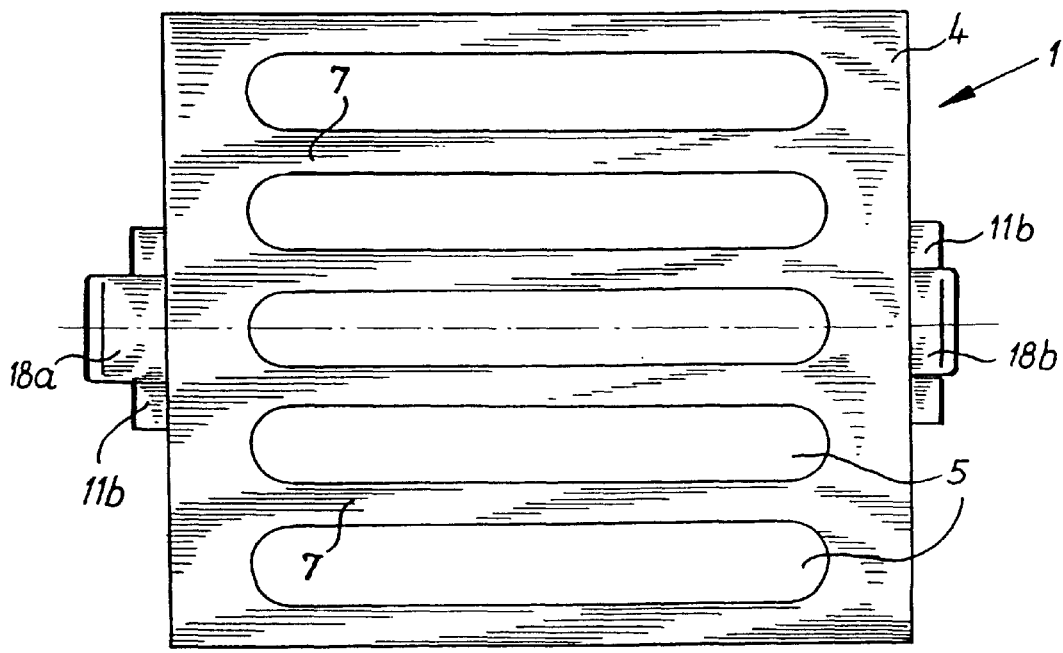
FIG. 2 is a top view of a cover for a fan according to the invention.

As FIG. 1 and in particular the top view shown in FIG. 2 of the cover 1 according to the invention illustrate, the cover 1 includes a cover plate 4, which is equipped with air through-flow openings 5 and cross members 7. The air through-flow openings 5 are constructed as elongated holes, which are nearly extended across the entire width of the cover plate 4, so that cover plate 4 has a grate- or grid-like design. The air through-flow openings 5 ensure the unhindered admission of air into the intake region 6 of the fan 2, while the connectors, pigtails, cables, ribbon conductors or other electrical connecting cables, which are located between the air through-flow openings 5 and which have been identified in FIG. 1 by the reference symbol 8, can be installed in such a manner that they do not come in contact with the fan 2. The air through-flow openings 5 can be constructed in a largely arbitrary manner with respect to their size, arrangement and form.

Figure 3:
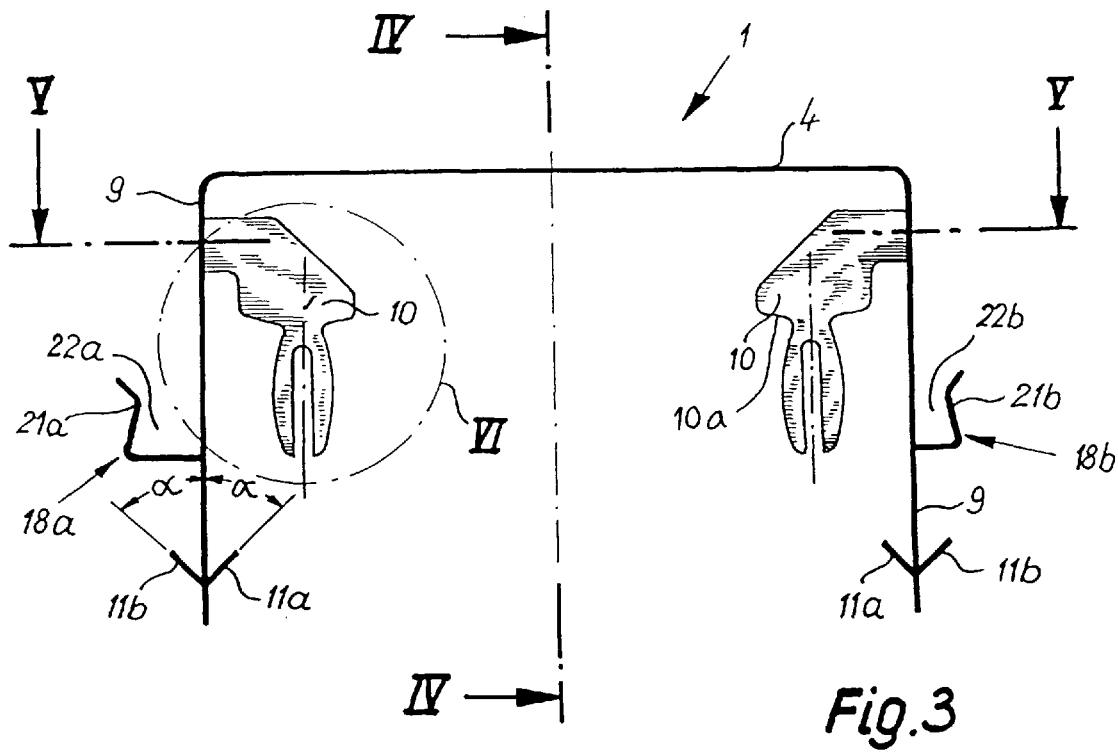
FIG. 3 is a front view of the cover according to the invention shown in FIG. 2.
Figure 4:
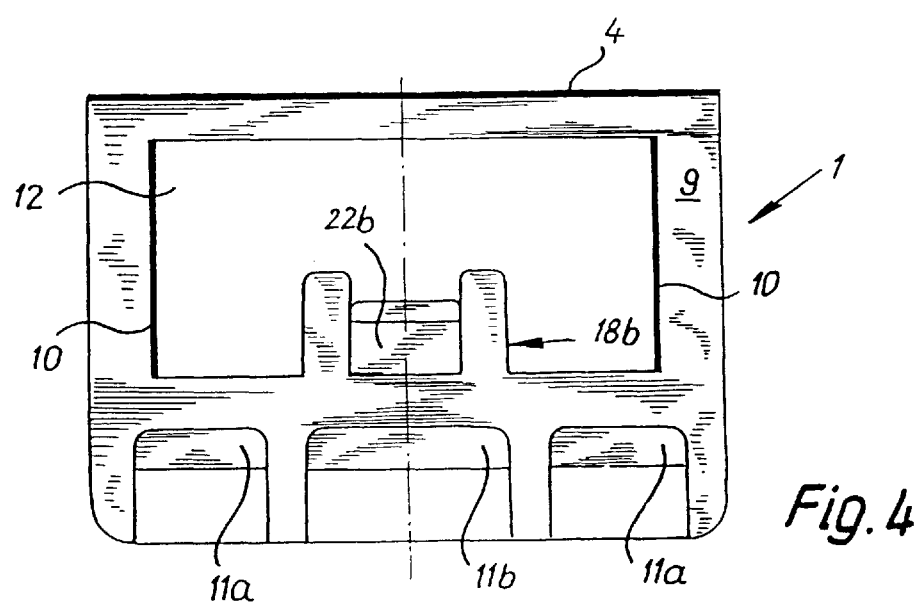
FIG. 4 is a cross-section of the cover according to the invention along the line IV—IV in FIG. 3.
Figure 5:
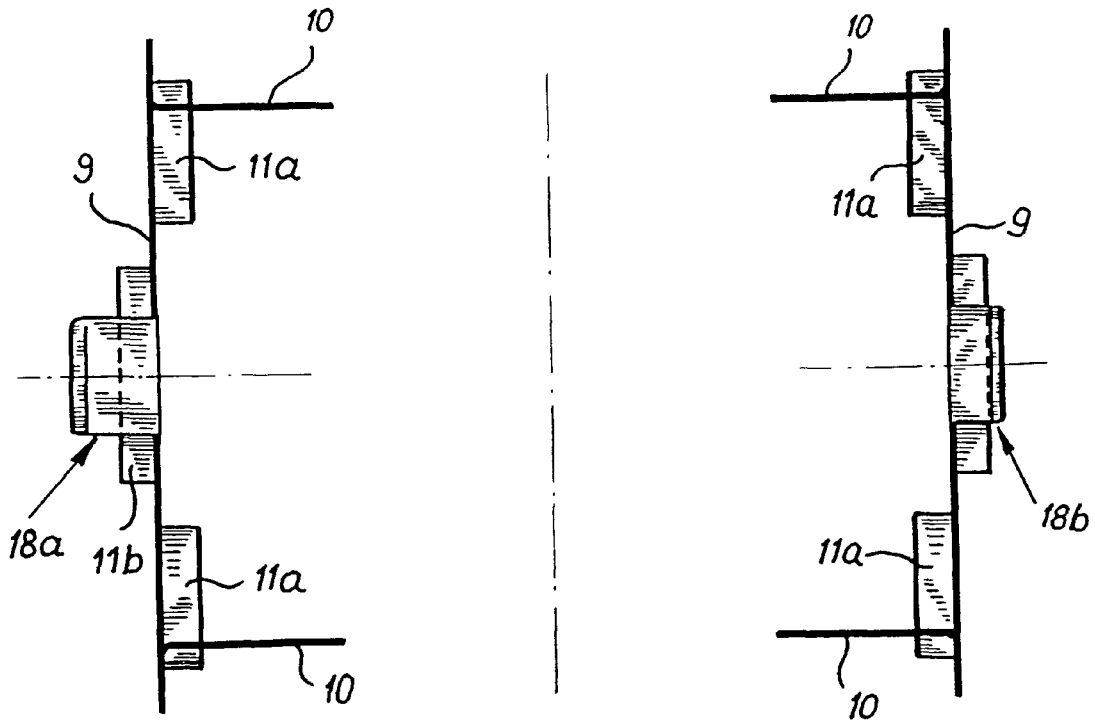
FIG. 5 is a section, which is extended parallel to the cover plate along the line V—V in FIG. 3 of the cover according to the invention.

FIGS. 3 to 5 show different further views of the cover 1 according to the invention, where the cover is presented by itself—without the fan 2 and the base 3. As can be seen from this, the cover 1 includes preferably two side walls 9, which are placed essentially at a right angle to the cover plate 4 and opposite to each other. The cover 1 thus has a basic bow-shaped configuration, where the cross-link (cover plate 4) of the bow in its assembled state encompasses the fan 2, and where the two free ends of the bow (side walls 9) are joined to the base 3 in such a way that they can be detached.

The cover 1 according to the invention, on the one hand, includes fastener elements 10 for the fan 2, which are connected to the cover plate 4, and on the other hand, fastener elements (11a, 11b) for the base 3, which are connected to the cover plate 4. The fastener elements 10, (11a, 11b) are constructed in such a manner that the cover plate 4 can be attached in a position where it is spaced apart from the base 3 (distance A in FIG. 1). The fan 2 is attached to the cover plate 4 and thus mounted on the base and located in an intermediate position. In the example of the embodiment shown, the fastener elements 10, 11 are located at the side walls 9 or they are generated from portions of the side walls 9, while two fastener elements 10 for the fan 2 are located on each side wall 9.

Furthermore, the fastener elements 10 for the fan 2 are preferably constructed in such a manner, that the fan 2, which attached to the bottom side of the cover plate 4 and located between the side walls 9, is positioned in such a way that it is placed at a distance (distance B in FIG. 1) from the cover plate 4. The distance between the fan 2 and the cover plate 4 represents a safety distance, which ensures that the rotating parts of the fan 2 do not come in contact with the electrical leads 8, which are installed above the cover plate 4. Furthermore, the distance B ensures a sufficient free volume of the intake space 6 above the fan 2, so that a sufficient amount of cooling air can be made available at all times.

According to the invention, the cover 1 also serves the purpose of attaching the fan 2 to the base 3. In this case, it is advantageous if the fastener elements 10 for the fan 2 have a spring-like elasticity. By this means, a positional compensation of the fan 2 can be achieved in a simple manner. The spring-like elasticity of the fastener elements 10 for the fan 2 can be achieved, for example, in such a manner, that the cover 1 is constructed as a formed part made of spring sheet steel or even as an injection-molded part of a plastic material with the corresponding material characteristics.

The fastener elements 10 for the fan 2 are—as shown—constructed as notched-out openings of the side walls 9, which are directed toward the inside, i.e. under the cover plate 4 and into the intake space 6. Such a construction can, for example, be achieved by means of a formed part made of sheet metal in a manner that makes it easy to manufacture it by bending the fastener elements 10 away from the side walls 9, by means of which the side walls 9, as shown for the cover plate 4, are provided with a large, open cross-section by the openings 12, see FIG. 4, which are generated in this manner, and through which air can be taken in.

Figure 6:
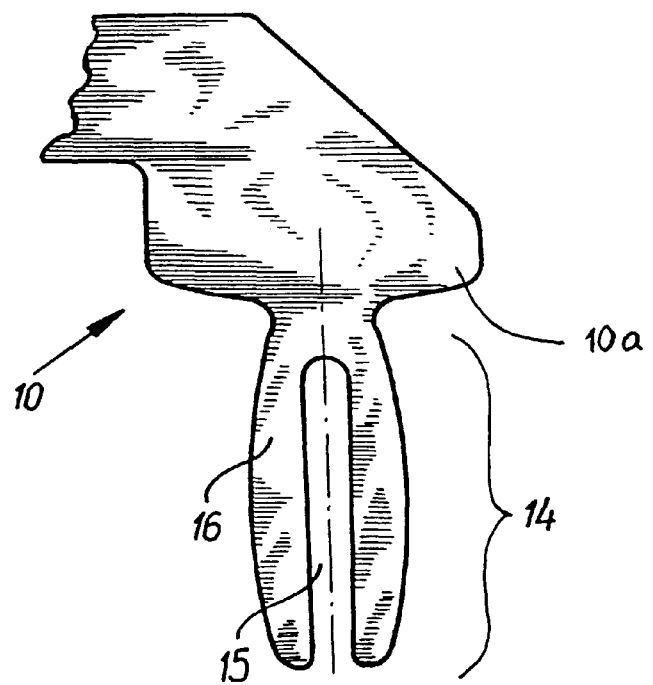
FIG. 6 is a detail VI, which is enlarged with respect to the front view in FIG. 3 of the cover according to the invention.

It is advantageous to construct the fastener elements 10 for the fan 2 as detent elements. As is shown, in particular, in a detail in FIG. 6 and in the broken-out region of FIG. 1, the fastener elements 10 for the fan 2 include a detent section 14 for the interlocking engagement of the corresponding openings 13, which are located in the fan 2, and which detent section is provided with a slot 15, and it is constructed as a spring-elastic flat ridge 16 having a convex cross-sectional contour. In the case of an injection-molded plastic part, a corresponding slotted peg could also be used instead of the ridge 16. By means of constructing the fastener elements 10 in this manner, the parts of the ridge 16 can be pushed together in the direction of the slot 15 when the ridge is inserted into the openings 13 of the fan 2, and they will hold the fan 2 and the cover 1 together when these parts are subsequently spread apart in the openings 13 under the influence of spring forces. Such a connection can easily be made and also subsequently once again broken. In this case, it is further advantageous if each fastener element 10 includes laterally adjacent to the ridge 16 contact regions 10a having a convex curvature in such a manner, that these contact regions 10a, see FIG. 1, achieve contact at the edge of the opening of each of the openings 13, and thus see to it that an especially good support as well as, advantageously, a compensating adjustment for the axial tolerance or clearance are achieved.

In contrast to the example of the embodiment shown, it is also within the scope of the invention, when the fastener elements 10 for the fan 2 are not engaging the fan 2 from above, but from the side, or also at another location, as shown; however, the embodiment shown is advantageous to the extent that in this case the four attachment holes (openings 13), which are present in commercially available fans, can be utilized for mounting the fan 2. The symmetrical arrangement of the fastener elements 10, which is especially clear in FIG. 5, in this case ensures, in particular, also an attachment method of the fan 2, which is low in vibrations and especially stable.

It would be advantageous for the production of an easily detachable connection for the cover 1 according to the invention, that not only the fastener elements 10 for the fan 2, but also the fastener elements 11a, 11b for the base 3 would be constructed as detent elements.

In the present case, the fastener elements 11a, 11b for the base 3 are constructed as notched-out openings in the side walls 9, which are directed toward both sides of the side walls 9. This is especially advantageous in the case of the base 3 shown here, which is a contoured heat sink, which, as shown in FIG. 1, includes cooling ribs 17, which are present at regular intervals (distance C in FIG. 1), between which ribs the fastener elements 11a, 11b can be inserted.

In this case, the fastener elements 11a, 11b for the base 3 are constructed in particular as spring-elastic notched-out openings of the side walls 9, which point in an upward direction, i.e. in the direction of the cover plate 4, and which openings are placed at an acute angle α (here 45°) with respect to the remaining portion of the side walls 9. In this manner, the fastener elements 11a, 11b form barbs, which point in a direction opposite to the mounting direction of the cover 1 and which can firmly grasp the base 3. In the embodiment shown in FIG. 5, there are located at the lower end of side wall 9, opposite the cover plate 4, always two fastener elements 11a pointing to the outside of side wall 9 and one fastener element 11b pointing to the opposite wall, or inside of, side wall 9. Alternatively, it is also possible to provide, e.g. multiple notched-out openings of the side walls 9, which have the shape of Christmas trees. The fastener elements 11a, 11b, which are constructed in this manner as claw-like connecting elements can also be used for the purpose of a compensatory adjustment of the distance C between the cooling ribs 17, because after the insertion of the heat sink between the ribs 17 they are under mechanical tension. By means of such a force-induced and/or form-fitting connection between the cover 1, which is connected to the fan 2, and the base 3, the fan 2 can always be firmly supported by the base 3, which has the further advantage of resulting in a noise reduction when it is in operation.

As can be seen from the figures of the drawings, the cover 1 according to the invention includes a still further advantageous development, especially with respect to its transport and handling: At each of the two side walls 9, there is always located a receiving part 18a, 18b for connecting cables 20 (FIG. 1) of the fan 2, which may under certain conditions be equipped with plugs 19. For the spring-loaded support of the connecting cables 20 or, as the case may be, the plugs 19, the receiving parts 18a, 18b are constructed as spring-elastic clamps. The receiving parts 18a, 18b are outwardly directed notched-out openings of the side walls 9, i.e. notched-out openings in the side walls 9 pointing away from the intake space 6 under the cover plate 4. They always include a ridge section 21a, 21b, see FIG. 3 which is directed upwardly, i.e. in the direction of the cover plate 4, in such a manner, that along the side walls 9, pocket sections 22a, 22b are formed, which are suitable for receiving the plugs 19 or the connecting cables 20, respectively, and to retain them by means of spring forces. In this case, the receiving parts 18a, 18b, which are located at the two opposite side walls 9, can be made in different sizes in order to accommodate plugs 19 of different sizes (e.g. Berg plugs, Molex plugs), which allows them at the same time to carry out an identifying function for the electrical connection of the fan 2 during the assembly process.

In order to allow them to be handled without difficulty and to be transport easily and without any required preceding packaging efforts, but also in their assembled state, the plugs 19 or the connecting cables 20, respectively, may be retained in the receiving parts 18a, 18b, especially after the fan 2 is attached to the cover 1 as part of a, for example, pre-assembly process by the manufacturer, and thus a fan sub-assembly has been produced, which is ready for shipment and final assembly.

The invention is not limited to the examples of embodiments described, but it also includes all embodiments producing equal results within the spirit of the invention. In particular, if required, especially when dealing with heat sinks, the fastener elements for the base 3 can, for example, be constructed as detent elements with detent projections, which can, for example, engage complementary detent openings in a plate. Likewise, it is within the scope of the invention, if the cover 1 has four side walls 9 for the sake of a greater stability, or if, for the sake of adapting it to the form of the fan 2, it has a shape—in contrast to that of the presentation in FIG. 2 which is of a circular configuration, when viewed from above, and it has only one enclosing side wall 9.

Besides the two indicated functions, the cover 1 according to the invention can also perform the function of a part, which conducts heat away, and which has a coating of textured paint for this purpose, so that the area of the heat exchange surface is increased.

It may also be advantageous and preferable if the cover 1 according to the invention is made in one piece.

Furthermore, the invention is not limited to the combination of characteristics defined in claim 1, but it may also be defined by any desired other combination of certain characteristics of all the individual characteristics disclosed as a whole. This means, that in principle, practically every individual characteristic of claim 1 may be left out or be replaced by at least one individual characteristic, which has been disclosed in another part of the application.

What is claimed is:

1. A cover for a fan mountable on a base for cooling electronic sub-assemblies or elements, located on said base comprising a cover plate having air through-flow openings and having fastener elements independently fastening said fan to said cover plate, and further having fastener elements fastening said base to said cover plate, said fastener elements being constructed in such a manner, that said cover plate is detachably attached with a distance A to said base in a position with a bottom side of said cover plate over said fan whereby said fan detachably attached to said cover plate is placed in a position between said cover plate and said base.

2. The cover according to claim 1, characterized by at least two side walls, which are essentially at right angles to said cover plate and located opposite each other.

3. The cover according to claim 1, characterized in that fastener elements fastening said fan to said cover plate are constructed in such a manner that said fan, which is detachably attached to said cover plate between said bottom side of said cover plate and said base assumes a position where it is located at a distance from the bottom side of said cover plate, whereby said distance defines an intake region below said cover plate.

4. The cover according to claim 1, characterized in that said fastener elements fastening said fan to said cover plate have a spring-like elasticity.

5. The cover according to claim 2, characterized in that said fastener elements fastening said fan to said cover plate are located at said two side walls, which are opposite each other.

6. The cover according to claim 2, characterized in that said fastener elements fastening said fan to said cover plate are constructed as protrusions from said side walls, which are directed toward the inside below said cover plate.

7. The cover according to claim 1, characterized in that said fastener elements fastening said fan to said cover plate are constructed as detent element.

8. The cover according to claim 7, characterized in that said fastener elements fastening said fan to said cover plate include a detent section for an interlocking engagement of openings, which are located in said fan, which detent section is constructed as a spring-elastic ridge having a slot, which has a convex cross-sectional curvature.

9. The cover according to claim 2, characterized in that at each of said side walls two of said fastener elements fastening said fan to said cover plate have been provided.

10. The cover according to claim 1, characterized in that said fastener elements fastening said base to said cover plate are constructed as detent element.

11. The cover according to claim 2, characterized in that said fastener elements fastening said base to said cover plate are constructed as protrusions from said side walls, which are directed toward both sides of said side walls.

12. The cover according to claim 2, characterized in that said fastener elements fastening said base to said cover plate are constructed as protrusions from said side walls, which are upwardly directed in the direction of said cover plate, while the protrusions are positioned at an acute angle ($\alpha$) with respect to the remaining portion of said side walls.

13. The cover according to claim 2, characterized in that said fastener elements fastening said base to said cover plate are constructed as multiple protrusions from said side walls.

14. The cover according to claim 11, characterized in that at a lower end of each of said side walls, pointing away from said cover plate at least two of said protrusions, which are located at an edge and point toward one side of said side wall and at least one of said protrusions, which is located at the center and pointing toward the other side of said side wall, are placed.

15. The cover according to claim 2, characterized in that on at least one of said side walls a receiving part is placed for connecting cables of said fan.

16. The cover according to claim 15, characterized in that said receiving part is spring-elastic for the attachment of said connecting cables under spring forces.

17. The cover according to claim 15, characterized in that said receiving part is constructed as a protrusion from said side wall, which points toward the outside away from said intake region below said cover plate.

18. The cover according to claim 15, characterized in that said receiving part includes a ridge section, which points in an upward direction directed to said cover plate, in such a manner, that a pocket-like section is generated at said side wall.

19. The cover according to claim 15, characterized in that at each of the two oppositely located side walls (9) a receiving part (18*a*, 18*b*) is positioned, while the receiving parts are sized to accommodate said fan plugs.

20. The cover according to claim 1, characterized by a one-piece construction, in particular in the form of formed sheet metal parts or injection-molded plastic parts.

21. The cover according to claim 1, characterized by a coating of textured coating material.

22. A fan sub-assembly for the cooling of electronic sub-assemblies or elements which are located on a base comprising:

a fan; and a cover including a cover plate, which is equipped with air through-flow openings, fastener elements for independently fastening said fan to said cover, and fastener elements fastening said base to said cover, where said fastener elements are constructed in such a manner, that said cover plate detachably attached to said base in a position with a bottom side of said cover plate over said fan is placed at a distance from said base and where said fan, detachably attached to said cover plate, is placed between said cover plate and said base.

23. The cover according to claim 13, characterized in that said fastener elements fastening said base to said cover plate have the form of a Christmas tree.

24. The cover according to claim 14, characterized in that said protrusions, which are located at said edge and point toward one of said side wall, point away from said side wall under said cover plate.

* * * * *